United States Patent [19]

Suzuki et al.

[11] Patent Number: 4,737,447

[45] Date of Patent: Apr. 12, 1988

[54] PROCESS FOR PRODUCING MICRO FRESNEL LENS

[75] Inventors: Shinichi Suzuki; Takashi Suemitsu; Takashi Niriki, all of Yamanashi, Japan

[73] Assignee: Pioneer Electronic Corporation, Tokyo, Japan

[21] Appl. No.: 873,306

[22] Filed: Jun. 9, 1986

Related U.S. Application Data

[63] Continuation of Ser. No. 669,793, Nov. 9, 1984, abandoned.

[30] Foreign Application Priority Data

Nov. 11, 1983 [JP] Japan .................. 58-210763

[51] Int. Cl.⁴ .............................................. G03C 5/00
[52] U.S. Cl. .................................. 430/321; 430/296; 430/324; 430/942; 430/945; 350/417; 350/452
[58] Field of Search ............... 430/321, 324, 296, 945, 430/942; 350/452, 417, 162.16

[56] References Cited

U.S. PATENT DOCUMENTS

| | | | |
|---|---|---|---|
| 4,153,654 | 5/1979 | Maffitt et al. | 264/1 |
| 4,176,277 | 11/1979 | Bricot et al. | 250/316.1 |
| 4,259,433 | 3/1981 | Mizobuchi et al. | 430/296 |
| 4,363,844 | 12/1982 | Lewis et al. | 428/65 |
| 4,449,916 | 5/1984 | Ito et al. | 425/174.4 |
| 4,472,124 | 9/1984 | Kashihara et al. | 425/3 |
| 4,530,736 | 7/1985 | Mutter | 156/643 |
| 4,576,850 | 3/1986 | Martens | 428/156 |
| 4,609,259 | 9/1986 | Suemitsu et al. | 350/417 |

FOREIGN PATENT DOCUMENTS

| | | | |
|---|---|---|---|
| 60-103307 | 6/1985 | Japan | 350/417 |
| 60-103308 | 6/1985 | Japan | 350/417 |

*Primary Examiner*—John Kittle
*Assistant Examiner*—José G. Dees
*Attorney, Agent, or Firm*—Finnegan, Henderson, Farabow, Garrett, and Dunner

[57] ABSTRACT

A process for producing a micro Fresnel lens comprising the following steps: applying a photoresist coat to a smooth-surfaced substrate such as a glass, plastic or metal plate; exposing the resist cost to actinic radiation such as an electron beam, laser beam or UV rays; developing the exposed coat to form a resist pattern duplicating concentric rings for the desired micro Fresnel lens; forming an electrode element on the resist pattern by depositing a conductive metal such as silver or nickel by sputtering or evaporation; forming a nickel layer on the conductive metal electrode element by depositing metallic nickel or a nickel compound through electroforming wherein the pattern of the concentric rings is transferred onto the nickel layer with the conductive metal being used as an electrode; forming a nickel stamper by peeling the nickel layer from both the electrode and the substrate; and forming a micro Fresnel lens on the nickel stamper by either the photopolymerization or injection method of duplication.

13 Claims, 4 Drawing Sheets

PROCESS FOR PRODUCING MICRO FRESNEL LENS

This application is a continuation, of application Ser. No. 669,793, filed Nov. 9, 1984, abandoned.

BACKGROUND OF THE INVENTION

The present invention relates to a process for producing a micro Fresnel lens having fine concentric rings formed on the surface as stepped setbacks.

Conventional optical lenses are manufactured by grinding and polishing glass, plastic and other transparent blanks to give a convex or concave surface of the desired radius. Therefore, the physical constants of an optical lens such as numerical aperture (NA), focal length and F number can only be determined by the lens material and the polishing of transparent blanks such as glass and plastics.

The conventional method of preparing a glass lens is shown in FIG. 1; a glass lens blank 2 fixed on a table 1 is capped with a polishing mold 3 which is rotated about its axis, with an abrasive and water being kept supplied, to polish the blank and produce a glass lens having the desired curvature and spherical surface.

An example of the conventional method for preparing a plastic lens is shown in FIG. 2; a plastic lens blank 5 fixed on the bench of a numerically controlled lathe is ground with a cutting tool 6 by proper numeric control so as to produce a plastic lens having the desired curvature and spherical surface.

As shown above, the conventional methods for producing optical lenses must depend on the skill of experienced operators, and the low cost-effectiveness of these methods has long been one of the greatest concerns to the industry.

Lens aberrations such as chromatic aberration, astigmatism, field curvature and sperhical aberration cannot be well corrected by the physical constants of lens. Chromatic aberration is conventionally corrected by assembling a plurality of lenses, but astigmatism, field curvature and spherical aberration can only be reduced by polishing the lens blank to a precise curvature and spherical surface.

SUMMARY OF THE INVENTION

Therefore, the primary object of the present invention is to provide a process for producing a micro Fresnel lens that depends on the diffraction of light rather than its refraction that is used in conventional glass and plastic lenses and which causes undesired lens aberrations such as astigmatism, coma, field curvature and spherical aberration. The process of the present invention is characterized not only by using a nickel stamper prepared by electroforming but also by the ability of manufacturing the desired Fresnel lens at a much lower cost.

According to the present invention, there is provided a process for producing a micro Fresnel lens comprising the following steps: applying a photoresist coat to a smooth-surfaced substrate such as a glass, plastic or metal plate; exposing the resist coat to actinic radiation such as an electron beam, laser beam or UV rays; developing the exposed coat to form a resist pattern duplicating concentric rings for the desired micro Fresnel lens; forming an electrode element on the resist pattern by depositing a conductive metal such as silver or nickel by suitable means such as sputtering or evaporation; forming a nickel layer on the conductive metal electrode element by depositing metallic nickel or a nickel compound through electroforming wherein the pattern of the concentric rings is transferred onto the nickel layer with the conductive metal being used as an electrode; forming a nickel stamper by peeling the nickel layer from both the electrode and the substrate; and forming a micro Fresnel lens on the nickel stamper by either the photopolymerization or injection method of duplication.

BRIEF DESCRIPTION OF THE DRAWINGS

FIGS. 3 to 7 show one embodiment of the process of the present invention, in which:

FIGS. 3 and 4 are a cross section and a plan view of a substrate with a predetermined resist pattern;

FIG. 5 is a section of the substrate with a silver coat formed on the resist pattern;

FIGS. 6 and 7 are cross sections showing in sequence the making of a nickel stamper;

DETAILED DESCRIPTION OF THE PREFERRED EMBODIMENTS

One embodiment of the process of the present invention is hereunder described by reference to FIGS. 3 to 7.

Figure 1:
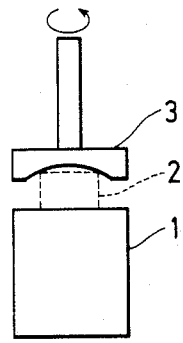
FIG. 1 illustrates a typical method for fabricating the conventional glass lens.
Figure 2:
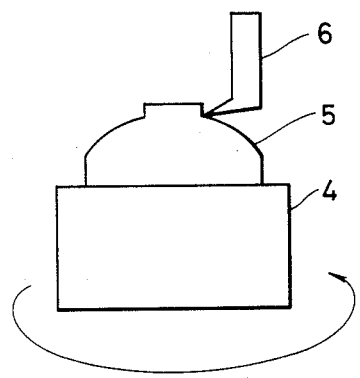
FIG. 2 shows a typical method for fabricating the conventional plastic lens.
Figure 3:
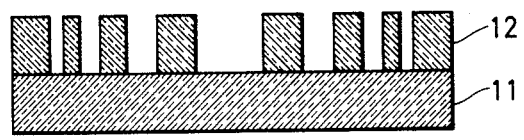
Figure 4:
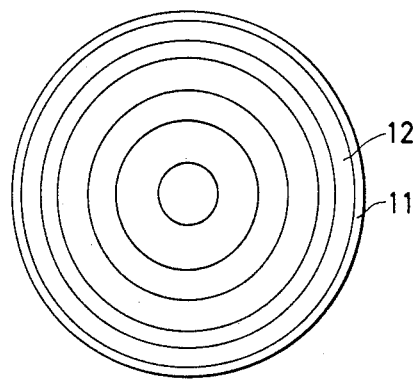
Figure 5:
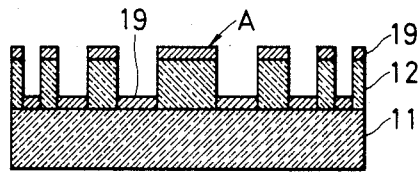
Figure 6:
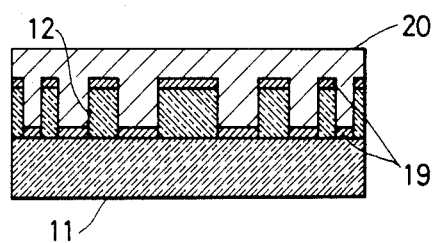
Figure 7:
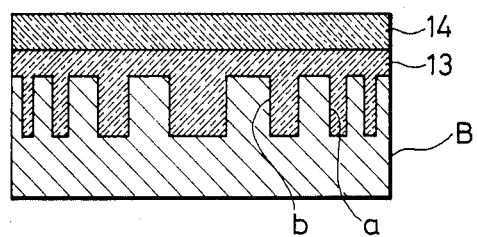

A smooth-surfaced glass blank 11 is coated with a resist layer 12, which is exposed to actinic radiation such as an electron beam, laser light or UV rays. Upon development, concentric rings of a pattern as shown in FIGS. 3 and 4 are formed on the resist layer 12. A silver coat 19 is deposited on the resist layer 12 by a suitable method such as sputtering or evaporation. The resulting electrode element A is used in subsequent electroforming for depositing nickel on the silver coat 19 until a flat nickel sheet 20 is obtained. The sheet 20 is then peeled from the electrode element A to make a nickel stamper B having concentric rings a that duplicate those formed on the resist layer 12.

A photopolymer is dripped on the grooved surface of the nickel stamper to form a photopolymer layer 13. A glass plate or acrylic resin plate 14 having a high degree of flatness is pressed against the photopolymer layer 13, which is then cured lightly by illumination with UV radiation that is applied through the acrylic resin plate 14. The lightly cured photopolymer layer 13 is peeled from the nickel stamper B; the surface b of the peeled photopolymer layer 13 duplicates the concentric rings a on the nickel stamper B except that a ridge on surface b corresponds to a groove on face a, and vice versa.

The grooved surface b of the photopolymer layer 13 is irradiated with a sufficient amount of UV rays to cure said layer completely, thereby producing a micro Fresnel lens duplicating the nickel stamper B. The fabrication process is completed by depositing an antireflection film on that surface of the lens upon which incident light falls.

Figure 8:
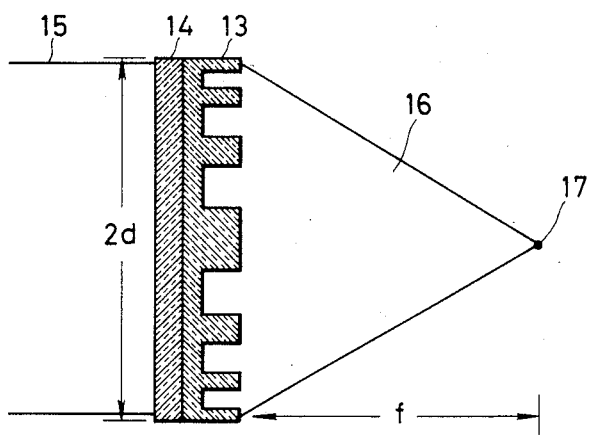
FIG. 8 is a sketch of the diffraction of light emerging from the micro Fresnel lens of the present invention.

The light concentrating effect of the micro Fresnel lens produced by the method shown above is illustrated in FIG. 8; an incident light 15 failing on the acrylic resin plate 14 as plane wave (parallel rays) passes through the micro Fresnel lens and emerges from the grooved surface b. Due to diffraction, the emerging light changes to a spherical wave 16 and forms the smallest spot on focal point 17.

Suppose the lens has a focal length f and a diameter $2d$. If the laser spot sizes for spot intensities which are $\frac{1}{2}$ and $1/e^2$ of the center intensity are written as $2a_1/2$ and $2a_1/e^2$, respectively, the following relations are valid:

$2a_1/2 = 1.03 \lambda F$
$2a_1/e^2 = 1.67 \lambda F$ (F: F number of the lens, $F=f/2d$, $\lambda$: the operating wavelength of the laser).

It is therefore clear that a smaller spot size can be obtained by using a lens of a smaller F number. When $2d=0.4$ mm, $f=0.25$ mm, and $\lambda=0.6328$ μm, the laser spot sizes are:

$2a_1/2 = 0.41$ μm $2a_1/e^2 = 0.66$ μm.

As will be understood from the foregoing explanation, a laser spot size of 1 μm or less can be easily obtained by using the micro Fresnel lens of the present invention.

Figure 9:
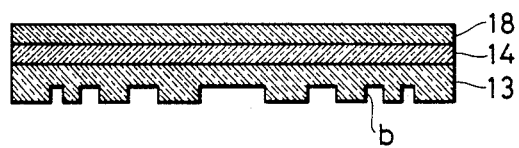
FIG. 9 is a cross section showing the final step of fabricating the micro Fresnel lens by photopolymerization.

FIG. 9 shows one embodiment of the micro Fresnel lens prepared by the present invention, in which the glass or acrylic resin plate 14 is provided, by either evaporation or sputtering, with an anti-reflection coat 18 made of three layers of magnesium fluoride $MgF_2$, silicon dioxide $SiO_2$ and zirconium oxide $ZrO_2$.

The lens without the anti-reflection coat 18 has a light concentration efficiency of 35%, which is increased up to 40% by using the anti-reflection coat. This coat also has the advantage of protecting the glass or acrylic resin plate from surface damage.

Figure 10:
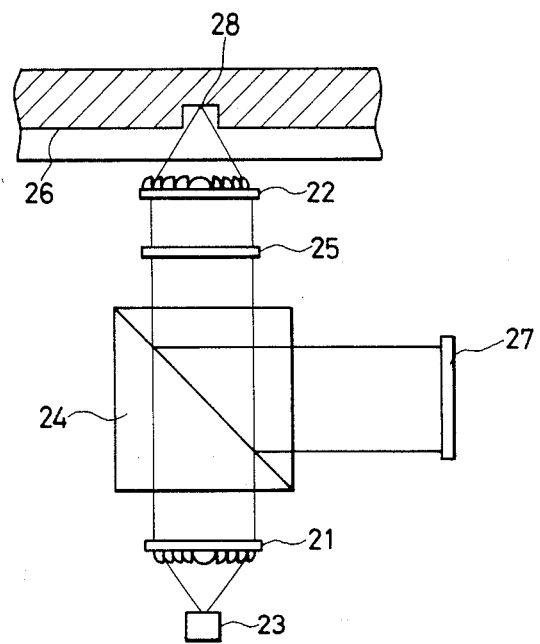
FIG. 10 is a sketch of an optical pickup system using the micro Fresnel lens of the present invention.

The micro Fresnel lens according to the present invention may be incorporated in optics for optical disks (laser disks, LD, and compact disks, CD) as illustrated in FIG. 10. The optical system shown in FIG. 10 includes two units of the micro Fresnel lens 21 and 22 which are respectively used as a collimating lens and an objective lens the latter requiring high beam concentration efficiency. A light issuing from a laser diode 23 is made parallel by the collimating lens 21, and after passing through a beam splitter 24 and a quarter-wave plate 25, the light is converged by the objective lens 22 to fall on the surface of a small pit 28 in an optical disk 26. The light is reflected from the pit 28, collimated by the objective lens 22, and is passed through the plate 25 and light-refracting beam splitter 24 successively. Finally, the light is received by a laser beam receiving element 27 and picked up as a signal current.

The micro Fresnel lens produced by the method of the present invention will find many other applications, such as in the optics of a projection television set.

The micro Fresnel lens according to the present invention has the following advantages. First, because of its ability to permit a smaller F number, the lens can be used as an objective lens in the pickup system for an optical disk, and the resulting laser spot size is sufficiently smaller than 1 μm to greatly reduce possible crosstalks. Secondly, the lens permits a larger NA, so a single unit of the lens can serve as an objective lens which is conventionally made of three or four separate lens units.

As a further advantage, a single unit of the micro Fresnel lens according to the present invention serves both as an objective lens and as a collimating lens. The resulting ease of optical axis adjustment leads not only to the obvious advantage of much faster adjustment but also to smaller and lighter optics for the pickup system of an optical disk. Fourthly, the lens according to the present invention is entirely free of aberrations at the operating wavelength of the laser used with an optical disk, and therefore, the lens is fully protected from increased aberrations due to the warpage or tilting of the disk.

A micro Fresnel lens having the advantages described above can be produced in much higher productivity by the method of the present invention. Furthermore, the nickel stamper from which the lens is duplicated is fabricated by electroforming and ensure the exact transfer of the grooved surface of the desired lens. Furthermore, nickel has a sufficient harness to reduce wear, and hence, the requiried number of stamper replacements. Because of these features, the process of the present invention enables micro Fresnel lenses of consistent quality to be mass-produced at low cost without resorting to the experience of skilled operators.

We claim:

1. A process for producing a micro Fresnel lens comprising the following steps:
    applying a photoresist layer to a smooth surfaced substrate;
    exposing the photoresist layer to concentric rings of actinic radiation;
    developing the exposed photoresist layer to form a photoresist pattern duplicating concentric rings for the desired micro fresnel lens;
    forming an electrode element on said resist pattern by depositing a conductive metal;
    depositing a nickel layer on said conductive metal electrode element through electroforming wherein the pattern of the concentric rings is transferred onto said nickel layer with said conductive metal being used as an electrode;
    peeling said nickel layer from both the electrode and the substrate to form a nickel stamper;
    applying a liquid polymer on the grooved surface of said nickel stamper to form a photopolymer layer;
    pressing a highly flat plate, substantially transparent to UV radiation, against the photopolymer layer;
    curing said photopolymer layer by illumination with UV radiation that is propagated through said flat plate; and
    peeling said cured polymer layer from said nickel stamper.

2. The process of claim 1, wherein said smooth-surfaced substrate includes glass.

3. The process of claim 1, wherein said smooth-surfaced substrate includes plastic.

4. The process of claim 1, wherein said smooth-surfaced substrate includes metal.

5. The process of claim 1, wherein said actinic radiation comprises electron beam.

6. The process of claim 1, wherein said actinic radiation comprises laser beam.

7. The process of claim 1, wherein said actinic radiation comprises UV rays.

8. The process of claim 1, wherein said conductive metal is one selected from the group consisting of silver and nickel.

9. The process of claim 1, wherein the step of forming and depositing the nickel layer comprises depositing metallic nickel by sputtering.

10. The process of claim 1, wherein the step of forming and depositing the nickel layer comprises depositing nickel compound by sputtering.

11. The process of claim 1, wherein the step of forming and depositing the nickel layer comprises depositing metallic nickel by evaporation.

12. The process of claim 1, wherein the step of forming and depositing the nickel layer comprises depositing nickel compound by evaporation.

13. The process of claim 1, wherein the step of applying the liquid photopolymer comprises dripping the photopolymer on the grooved surface of the nickel stamper.

* * * * *